US008577656B1

(12) United States Patent
Teng et al.

(10) Patent No.: US 8,577,656 B1
(45) Date of Patent: Nov. 5, 2013

(54) METHODS AND SYSTEMS FOR NUMERICALLY SIMULATING INFLATION OF AN AIRBAG CONFIGURED WITH A PLURALITY OF CONNECTED FLEXIBLE-BOUNDARY VOLUMES

(75) Inventors: Hailong Teng, Livermore, CA (US); Chi-Hsien Wang, Pleasanton, CA (US)

(73) Assignee: Livermore Software Technology Corp., Livermore, CA (US)

( * ) Notice: Subject to any disclaimer, the term of this patent is extended or adjusted under 35 U.S.C. 154(b) by 224 days.

(21) Appl. No.: 13/237,607

(22) Filed: Sep. 20, 2011

(51) Int. Cl.
*G06G 7/48* (2006.01)

(52) U.S. Cl.
USPC .......................................................... 703/7

(58) Field of Classification Search
USPC .......................................................... 703/7
See application file for complete search history.

(56) References Cited

U.S. PATENT DOCUMENTS

| 5,460,403 | A * | 10/1995 | Hansen et al. | 280/732 |
| 5,489,117 | A * | 2/1996 | Huber | 280/738 |
| 7,590,514 | B1 * | 9/2009 | Olovsson | 703/6 |
| 7,762,580 | B2 * | 7/2010 | Breed | 280/730.2 |
| 7,803,724 | B2 * | 9/2010 | Ting et al. | 442/16 |
| 2006/0273558 | A1 * | 12/2006 | Breed et al. | 280/730.2 |

OTHER PUBLICATIONS

Olovsson et al. ("Corpuscular method for ODP simulations,difficulty dealing with small vent holes", LS-DYNA Anwenderforum, Frankenthal,2007,pp. 1-4).*

\* cited by examiner

*Primary Examiner* — Omar Fernandez Rivas
*Assistant Examiner* — Iftekhar Khan
(74) *Attorney, Agent, or Firm* — Roger H. Chu

(57) ABSTRACT

Systems and methods for numerically simulating inflation of an airbag configured with more than one connected flexible-boundary volumes (i.e., primary and secondary pouches) are disclosed. A finite element analysis model of such airbag is defined in the airbag's folded configuration. Numerical simulation of inflating the primary pouch is based on corpuscular particle theory by interacting simulated corpuscular or gas particles with one another and with the shell elements representing the primary pouch. The simulated corpuscular particles are created by flow characteristics generated by an explosive blast. Numerical simulation of inflating the secondary pouch is based on control volume theory by converting kinetic energy of those of the simulated corpuscular particles having flowed through the interconnected opening from the primary to the secondary pouch to a uniform pressure. The uniform pressure is then applied onto the shell elements representing the secondary pouch.

17 Claims, 7 Drawing Sheets

402

$$p = (\gamma - 1)\frac{E_0 + E_{in}}{V}$$

502

504

METHODS AND SYSTEMS FOR NUMERICALLY SIMULATING INFLATION OF AN AIRBAG CONFIGURED WITH A PLURALITY OF CONNECTED FLEXIBLE-BOUNDARY VOLUMES

BACKGROUND OF THE INVENTION

1. Field of the Invention

The present invention generally relates to methods, systems and software product used in the area of computer-aided engineering analysis, more particularly to numerically simulating inflation of an airbag configured with a plurality of connected flexible-boundary volumes (e.g., an airbag having more than one connected pouches for protecting occupants in an automobile during a car crash).

2. Description of the Related Art

Continuum mechanics has been used for simulating continuous matter such as solids and fluids (i.e., liquids and gases). Differential equations are employed in solving problems in continuum mechanics. Many numerical procedures have been used. One of the most popular methods is finite element analysis (FEA), which is a computerized method widely used in industry to model and solve engineering problems relating to complex systems such as three-dimensional non-linear structural design and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are referred to as finite elements. The vertices of the finite elements are referred to as nodes. The model is comprised of a finite number of finite elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

One of the most challenging FEA tasks is to simulate an impact event such as car crash. As the modern computer improves, engineers not only wish to simulate the vehicle behavior in a car crash, they also want to simulate the occupant safety device such as airbag deployment during a car crash.

Traditional airbag is generally configured with one large bag, which is inflated with an explosive blast when a sensor detects a sudden de-acceleration such as a car crash. In certain situations, the heat generated by an explosive blast could cause a burn of the occupant's body when contacted with a rapid developing airbag.

A number of new approaches have been developed to solve this problem. One of them is an airbag configured with more than one connected pouches. The airbag is configured such that a primary pouch acted as a master is initially inflated by the blast. Then the secondary pouch is inflated by the air flowed through the connected openings between the primary and secondary pouches. Additionally, the secondary pouch is configured with outside openings to allow ambient air to be drawn in during the deployment of the secondary pouch. Since the secondary pouch does not receive the heat of the blast directly, it is less likely to cause a burn of the occupant's body.

However, there is no computer or numerical simulation method today that can properly simulate the inflation of such airbag. It would therefore be desirable to have new improved method and system for simulating inflation of an airbag having more than one connected flexible-boundary volumes.

SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

The present invention discloses systems and methods for numerically simulating inflation of an airbag configured with more than one connected flexible-boundary volumes (i.e., pouches). According to one aspect of the present invention, a finite element analysis (FEA) model of such airbag is defined in an airbag's initial folded configuration. The airbag is configured with at least primary and secondary pouches connected with one or more interconnected openings. Each of the pouches is represented by a plurality of shell finite elements.

Numerical simulation of inflating the primary pouch is based on corpuscular particle theory by interacting simulated corpuscular particles with one another and with the shell elements representing the primary pouch. The simulated corpuscular or gas particles are created by flow characteristics generated by an explosive blast.

Numerical simulation of inflating the secondary pouch is based on control volume theory by converting kinetic energy of those of the simulated corpuscular particles having flowed through the interconnected opening from the primary to the secondary pouch to a uniform pressure. The uniform pressure is then applied onto the shell elements representing the secondary pouch. In certain situations when the secondary pouch is configured with outside opening, ambient air pressure (e.g., atmosphere pressure) would contribute to the inflating of the secondary pouch.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION OF THE INVENTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-7. However, those skilled in the art will readily appreciate that the detailed description given herein with respect to these figures is for explanatory purposes as the invention extends beyond these limited embodiments.

Figure 1:
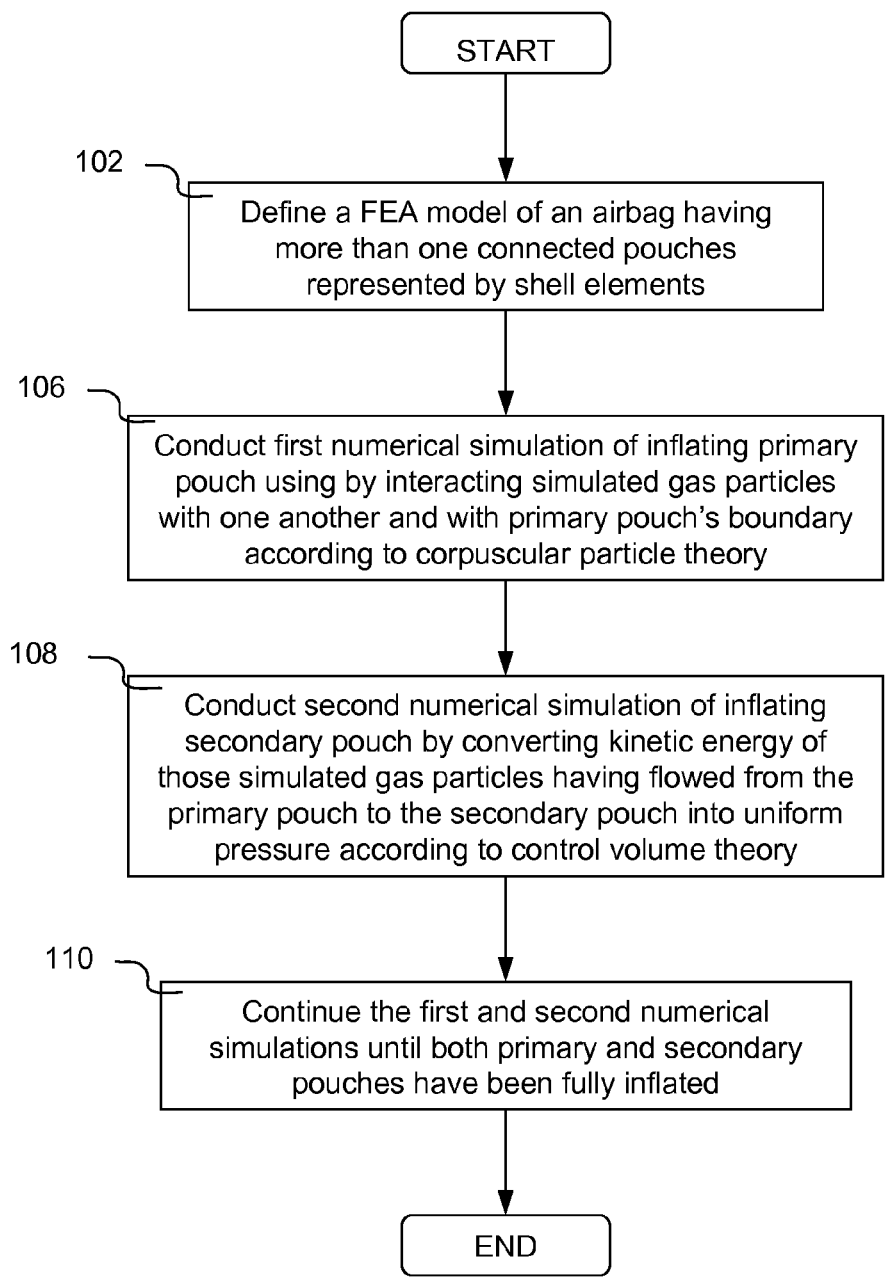
FIG. 1 is a flowchart illustrating an exemplary process of numerically simulating inflation of an airbag configured with at least primary and secondary connected pouches, the primary pouch being inflated by an explosive blast initially, while the secondary pouch being inflated by air through one or more interconnection openings between said primary and secondary pouches in accordance with one embodiment of the present invention.

Referring first to FIG. 1, it is shown a flowchart illustrating an exemplary process 100 of numerically simulating inflation of an airbag configured with more than one connected pouches in accordance with an embodiment of the present invention. Process 100 is preferably implemented in software and understood with other figures, especially FIG. 6.

Figure 6:
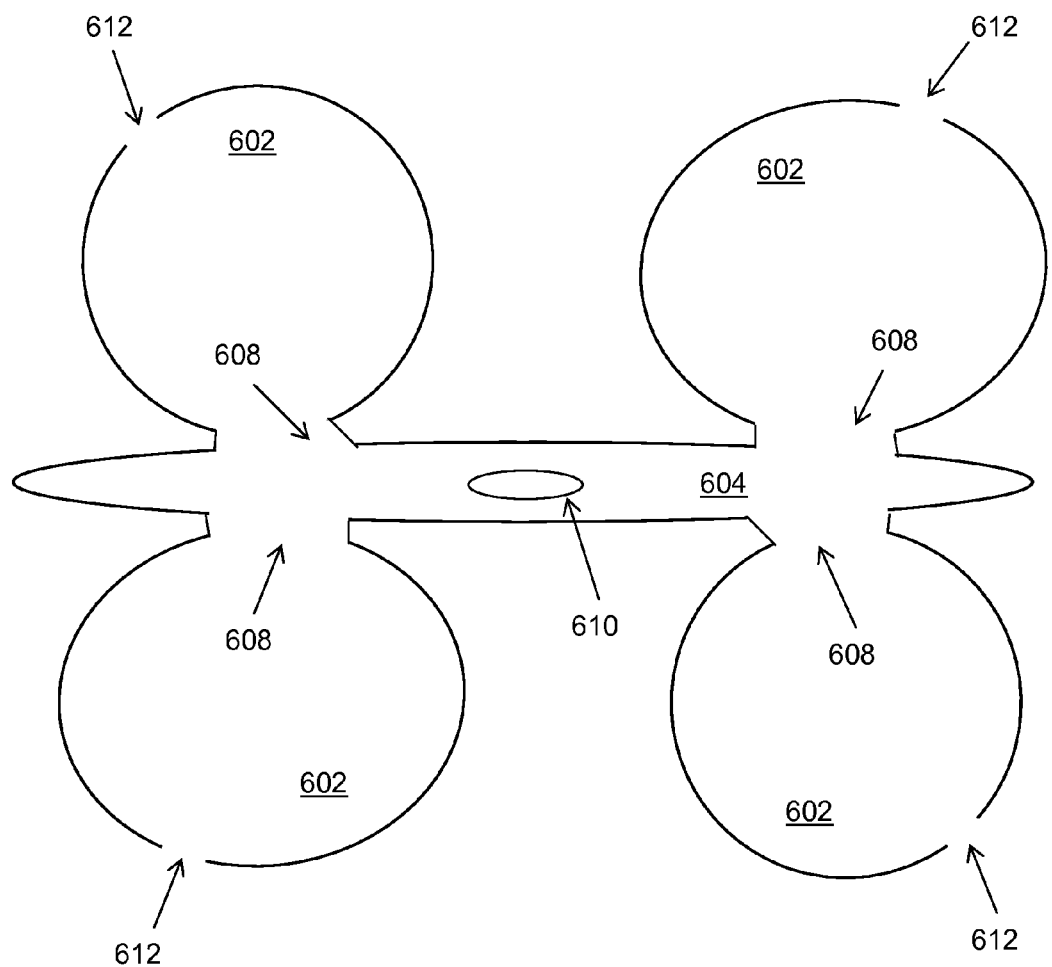
FIG. 6 is a two-dimensional diagram showing another exemplary airbag configured with at least primary and secondary pouches in accordance with one embodiment of the present invention.

Process 100 starts by defining a finite element analysis (FEA) model of the airbag in an initial folded configuration (e.g., configuration 210 shown in FIG. 2A) at step 102. Due to flexibility of the airbag, shell elements are used for modeling both primary and secondary pouches 602-604. A two-dimensional diagram showing an exemplary one of such airbag 600 is shown in FIG. 6. Primary pouches 602 are located in perimeter while the secondary pouch 604 is located in the center. A number of interconnection openings 608 are situated between the primary and secondary pouches. One or more air inlets or nozzles 612 are located on primary pouches 602 for receiving forced air as a result of an explosive blast. Finally, one or more outside openings 610 are optionally configured on the secondary pouch 604.

The primary and secondary pouches 602-604 are represented by first and second plurality of shell elements (not shown), respectively. The primary and secondary pouches 602-604 are connected through one or more interconnection openings or holes 608, which can be included in the FEA model with well known techniques, for example, no element between the interconnection openings 608.

Figures 4, 5:
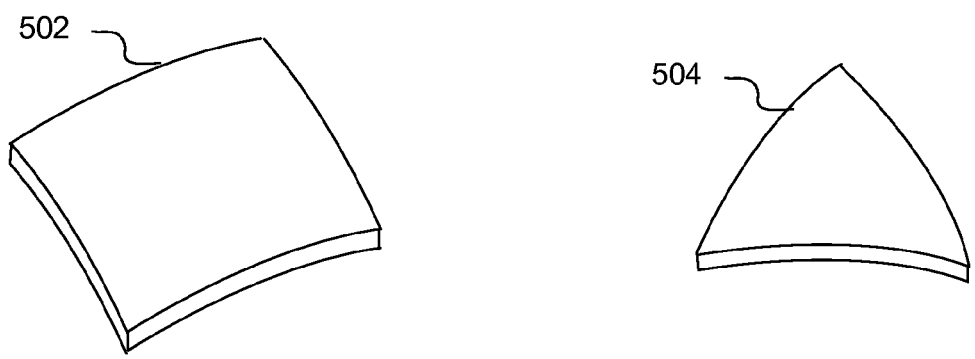
FIG. 4 shows an exemplary equation used for converting numerical kinetic energy of simulated corpuscular particles to uniform pressure applied to the secondary pouch in accordance with one embodiment of the present invention.
FIG. 5 is a diagram showing exemplary shell finite elements that can be used for modeling the flexible boundary of the airbag to be simulated according to an embodiment of the present invention.

It is well known that shell finite element is designed for simulating structural behaviors of membrane in FEA. Exemplary shell elements (e.g., quadrilateral 502 and triangular element 504) are shown in FIG. 5. The FEA model of both the primary and secondary pouches 602-604 contains more than one shell elements.

Next at step 106, a first numerical simulation of inflating the primary pouch 602 is performed using the FEA model according to corpuscular particle theory. In particular, a number of simulated corpuscular or gas particles are generated at each solution cycle of the numerical simulation (e.g., time marching or domain simulation) based on the explosive blast's strength (FIG. 3 shows a mass flow versus time chart that can be used for defining the strength of the blast). Each of the simulated corpuscular particles is assigned a numerical kinetic energy (i.e., a numerical value corresponding to kinetic energy of such particle) and an arbitrary random direction injected into the primary pouch through the air inlets or nozzles 612 initially. Then simulated corpuscular particles are tracked for collisions with one another and with the shell elements representing the primary pouch's flexible wall or boundary. At each collision, numerical kinetic energy is exchanged. The primary pouch is inflated when energy is transferred to the wall. More details about the interaction amongst simulated corpuscular particles, and between a simulated corpuscular particles and the primary pouch's flexible wall/boundary are described in FIGS. 2A-2C and corresponding descriptions.

Then at step 108, in conjunction with the first numerical simulation, a second numerical simulation of inflating the secondary pouch 604 is conducted according to control volume theory. In particular, numerical kinetic energy of any gas particle that has flowed through the interconnection openings 608 from the primary pouch to the secondary pouch are converted to a uniform pressure applied to the flexible wall of the secondary pouch 604. As a result, the secondary pouch 604 is inflated. According to one embodiment, the conversion is achieved using equation (i.e., Equation 402 of FIG. 4) as follows:

$$p = (\gamma - 1)\frac{E_0 + E_{in}}{V}$$

where:
 p is the uniform pressure,
 V is the secondary pouch's volume,
 γ is a gas dependent property—a ratio between heat capacities at constant pressure and at constant volume,
 Eo is the secondary pouch's existing numerical kinetic energy accumulated during prior solution cycles from those corpuscular particles that have flowed through the interconnected opening into the secondary pouch, $E_{in}$ is the numerical kinetic energy of said those of the simulated corpuscular particles having flowed from the interconnected openings 608.

When the secondary pouch is configured with one or more outside openings, ambient air would be drawn in during the inflation of the secondary pouch. The ambient air pressure contributes to the inflation of the secondary pouch in this situation.

Finally, at step 110, process 100 continues with simulations of inflating both the primary and secondary pouches until a predefined fully inflated condition has been met. The fully inflated condition can be defined in a number of well known methods, for example, pressure of the secondary pouch reaches certain level, the total simulation time has exceed certain milliseconds, etc.

Figure 2A:
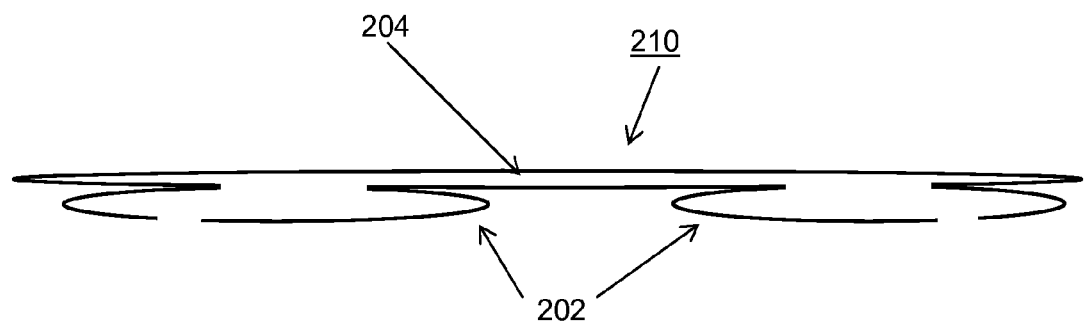
FIGS. 2A-2C are schematic diagrams collectively showing an exemplary sequence of numerical simulation of inflating the primary and secondary pouches based on corpuscular particle theory and control volume theory according to an embodiment of the present invention.
Figure 2B:
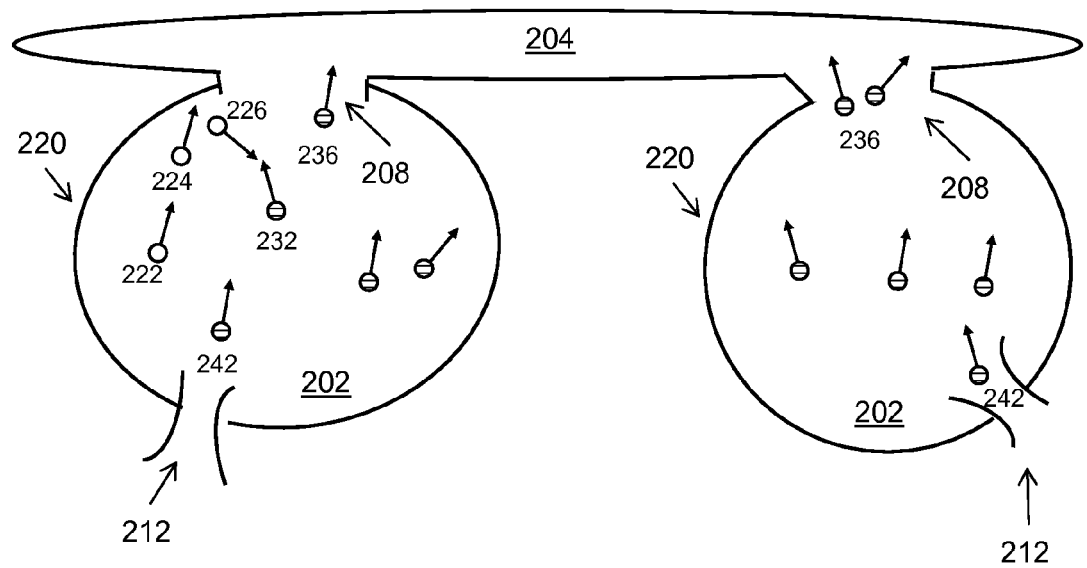
Figure 2C:
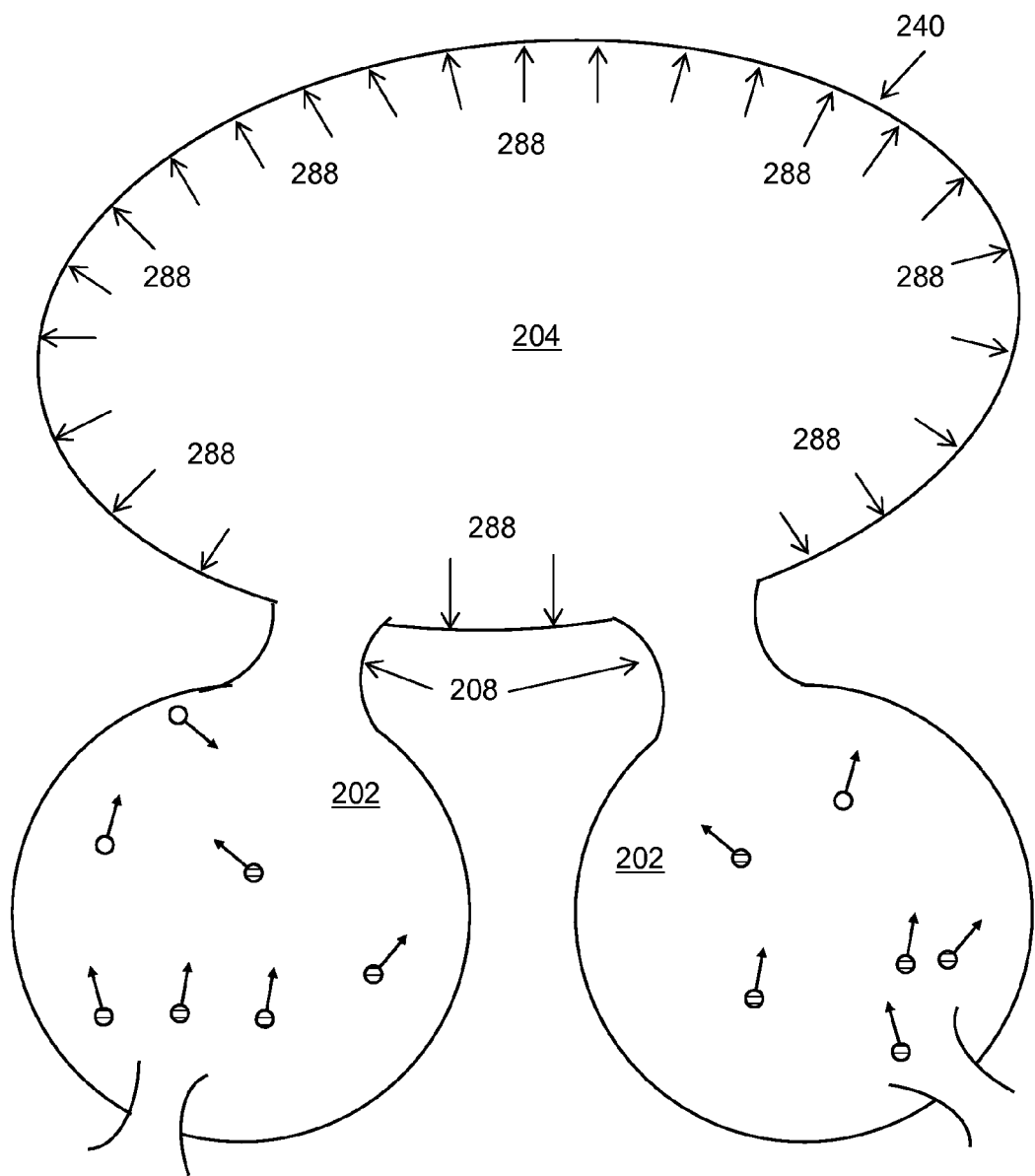
Figure 3:
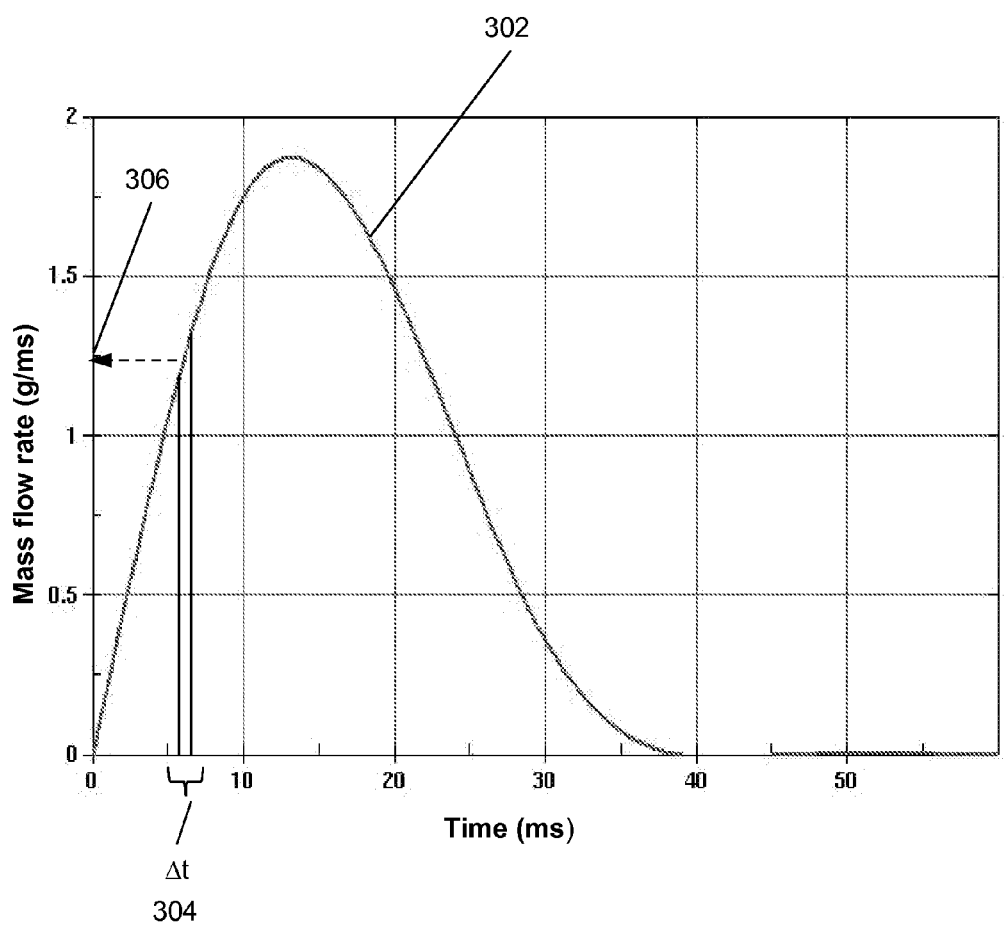
FIG. 3 is a chart showing mass flow rate versus time that can be used for defining explosive blast's strength in accordance with one embodiment of the present invention.

Referring now to FIGS. 2A-2C, there are shown schematic diagrams of an exemplary sequence of numerical simulation of inflating the primary and secondary pouches based on corpuscular particle theory and control volume theory according to an embodiment of the present invention. An initial fold configuration 210 of the airbag having primary and secondary pouches 202-204 is shown in FIG. 2A. It is noted that FIG. 2A is drawn exaggerated and not truly folded configuration for viewing purpose. Otherwise, actual folded configuration would show a single line or two lines with one stacked on top of another.

FIG. 2B is a schematic diagram showing inflating of primary pouch 202 based on corpuscular particle theory, in which simulated corpuscular particles are collided with one another and collided with the flexible boundary 220 of the primary pouch 202. In addition, some of the particles have flowed through the interconnection openings 208 from the primary pouch 202 to the secondary pouch 204. The boundary 220 may be made of plastics, fabrics, leathers, and the likes. In one embodiment, the initial geometry and material of the flexible boundary 220 is defined in the FEA model. The geometry of the boundary 220 is represented by a plurality of the shell elements. The material of the boundary 220 is represented by the nodal mass and the section properties of the shell elements. A plurality of new corpuscular particles 242 is created and injected into the primary pouch 202 with a arbitrarily random direction at each solution cycle of the simulation (e.g., time marching analysis with a number of solution cycles). Each of the new particles possesses a pre-determined mass m and a calculated average velocity v based on the temperature. The initial momentum and the translational kinetic energy of each of the particles are then computed with the mass and the average velocity as follows:

Momentum $I=mv$

Translational Energy $E_{TR}=\frac{1}{2}mv^2$

The total energy of a particle $E_{TOT}$ has two components: translation $E_{TR}$ and spinning-plus-vibration $E_{SV}$.

$$E_{TOT}=E_{TR}+E_{SV}$$

The initial balanced ratio $\alpha_0=E_{SV}/E_{TR}$ is fixed for a particular type of gases (e.g., 0.4 for air, 0 for helium, etc.). All of new and existing particles may collide with each other and with the boundary at each solution cycle. At each collision, an energy transfer will happen between the particle and the boundary or between the particles. The energy transfer is based the principles of mass, momentum and energy conservation as follows:

$$m_{a0}+m_{b0}=m_{a1}+m_{b1}$$

$$I_{a0}+I_{b0}=I_{a1}+I_{b1}$$

$$E_{TOT\,a0}+E_{TOT\,b0}=E_{TOT\,a1}+E_{TOT\,b1}$$

where the subscripts a and b represent two objects (i.e., particle and boundary, or particle and particle), and the subscripts 0 and 1 represent the state before and after the collision, respectively. In addition, the energy transfer also follows a set of rules as follows: 1) only the translation component is transferred in a particle-to-boundary collision; and 2) the initial balance ratio is restored only after a particle-to-particle collision.

Using the corpuscular particles 222 as an example, the particle 222 is created in the enclosed volume and travels towards the boundary 220. The particle energy $E_{TOT}$ has two components: translation $E_{TR}$ and spinning-plus-vibration $E_{SV}$. Just before the particle 222 collides with the boundary 220, the particle 222 is in position 224 having $E_{SV}$ and $E_{TR}$ with ratio $\alpha_0$. Similar, the boundary 220 has a mass and velocity. The mass of the boundary 220 at the point of collision is represented by an effective mass. In one embodiment, the effective mass is computed using nodal masses of a shell element in a finite element analysis model. The local coordinates of the shell element at the point of collision are used in the shape function of the shell element to calculate the contribution from each of the nodal masses. Right after the collision at position 226, a portion of translation component $E_{TR}$ is transferred to the boundary 220. The particle 222 carries a smaller $E_{TR}$ with a ratio $\alpha_1$, which is greater than $\alpha_0$ due to the reduction of $E_{TR}$. The particle 222 travels further and collides with another particle 232. The particles 222 and 232 exchange energies and the initial balanced ratio $\alpha_0$ is restored, while the velocity and the total translational energy are different after the collision. For illustration simplicity, only one particle 222 collides with the boundary 220 and with another particle 232 are shown in FIG. 2B.

As a result of energy transferred to the boundary 220, the primary pouch 202 is inflated. Some of the particles 236 would flow through the interconnection openings 208. Kinetic energy of those simulated particles 236 are converted into a uniform pressure 288 against boundary 240 to inflate the secondary pouch 204 as shown in FIG. 2C. In one embodiment, equation 402 is used for such conversion.

FIG. 3 shows a graphical chart 300 of mass flow rate versus time used as input in accordance with one embodiment of the present invention. The horizontal axis of the chart 300 represents the time in millisecond (ms) and the vertical axis represents mass flow rate of the gas to be used to inflate the enclosed volume in grams/ms. The curve 302 represents the mass flow rate over time hence the area under the curve 302 represents the total mass of the gas to be used to inflate the airbag of an automobile. The mass of the gases varies with different type of gases.

In one embodiment, the simulation of particle dynamics is based on a pre-determined number of corpuscular particles defined by users according to explosive blast's strength. The mass m of each of the particles is then obtained by dividing the total mass obtained from the chart 300 by the pre-determined number of particles. The initial average velocity $\overline{V}$ of each particle is a function of temperature T as follows:

$$\bar{V} = \sqrt{\frac{3RT}{M}}$$

where R is a constant and M is the molar mass.

In a time marching or domain numerical simulation, a set of new corpuscular particles are created to simulate the gas inflating the airbag at each solution cycle. At a particular solution cycle, the mass of new corpuscular particles to be created is obtained by multiplying the mass flow rate 306 of the solution time at that particular solution cycle with the time step size Δt 304 hence the number of the new corpuscular particles can be determined. Each of the new corpuscular particles is then created to simulate the inflation of the enclosed volume (e.g., an airbag in a vehicle) through at least one pre-defined nozzle location in random directions.

Figure 7:
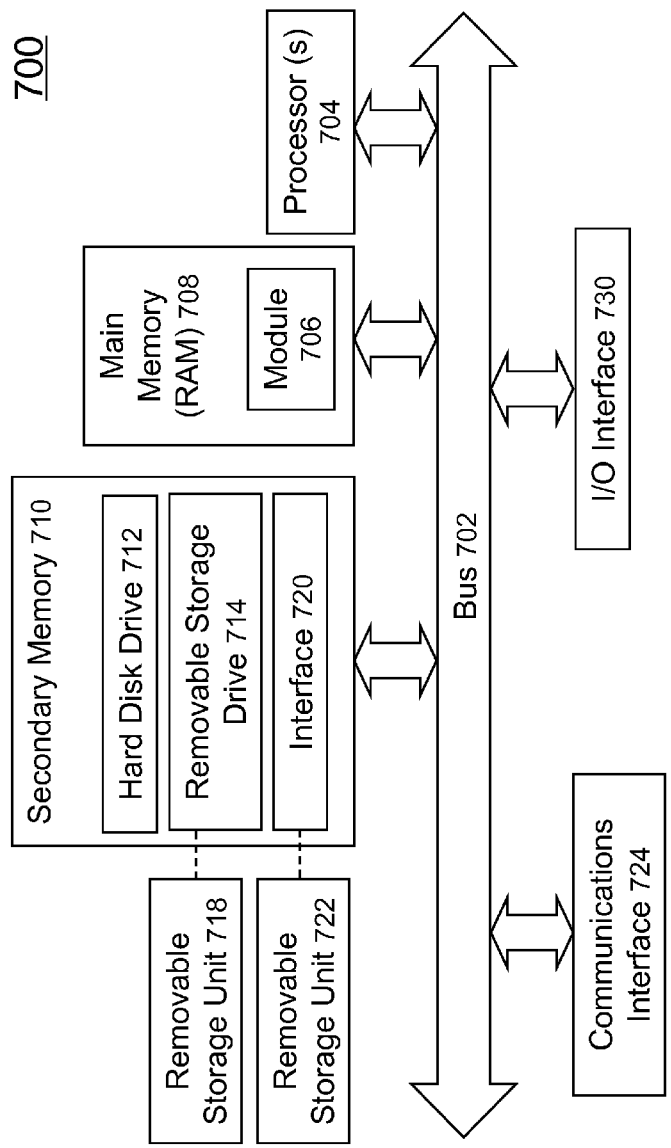
FIG. 7 is a function block diagram showing salient components of an exemplary computer system, in which one embodiment of the present invention may be implemented.

According to one aspect, the present invention is directed towards one or more computer systems capable of carrying out the functionality described herein. An example of a computer system 700 is shown in FIG. 7. The computer system 700 includes one or more processors, such as processor 704. The processor 704 is connected to a computer system internal communication bus 702. Various software embodiments are described in terms of this exemplary computer system. After reading this description, it will become apparent to a person skilled in the relevant art(s) how to implement the invention using other computer systems and/or computer architectures.

Computer system 700 also includes a main memory 708, preferably random access memory (RAM), and may also include a secondary memory 710. The secondary memory 710 may include, for example, one or more hard disk drives 712 and/or one or more removable storage drives 714, representing a floppy disk drive, a magnetic tape drive, an optical disk drive, etc. The removable storage drive 714 reads from and/or writes to a removable storage unit 718 in a well-known manner. Removable storage unit 718, represents a floppy disk, magnetic tape, optical disk, etc. which is read by and written to by removable storage drive 714. As will be appreciated, the removable storage unit 718 includes a computer usable storage medium having stored therein computer software and/or data.

In alternative embodiments, secondary memory 710 may include other similar means for allowing computer programs or other instructions to be loaded into computer system 700. Such means may include, for example, a removable storage unit 722 and an interface 720. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 722 and interfaces 720 which allow software and data to be transferred from the removable storage unit 722 to computer system 700. In general, Computer system 700 is controlled and coordinated by operating system (OS) software, which performs tasks such as process scheduling, memory management, networking and I/O services.

There may also be a communications interface 724 connecting to the bus 702. Communications interface 724 allows software and data to be transferred between computer system 700 and external devices. Examples of communications interface 724 may include a modem, a network interface (such as an Ethernet card), a communications port, a Personal Computer Memory Card International Association (PCMCIA) slot and card, etc. Software and data transferred via communications interface 724 are in the form of signals 728 which may be electronic, electromagnetic, optical, or other signals capable of being received by communications interface 724. The computer 700 communicates with other computing devices over a data network based on a special set of rules (i.e., a protocol). One of the common protocols is TCP/IP (Transmission Control Protocol/Internet Protocol) commonly used in the Internet. In general, the communication interface 724 manages the assembling of a data file into smaller packets that are transmitted over the data network or reassembles received packets into the original data file. In addition, the communication interface 724 handles the address part of each packet so that it gets to the right destination or intercepts packets destined for the computer 700. In this document, the terms "computer program medium", "computer usable medium", and "computer readable medium" are used to generally refer to media such as removable storage drive 714, and/or a hard disk installed in hard disk drive 712. These computer program products are means for providing software to computer system 700. The invention is directed to such computer program products.

The computer system 700 may also include an input/output (I/O) interface 730, which provides the computer system 700 to access monitor, keyboard, mouse, printer, scanner, plotter, and alike.

Computer programs (also called computer control logic) are stored as application modules 706 in main memory 708 and/or secondary memory 710. Computer programs may also be received via communications interface 724. Such computer programs, when executed, enable the computer system 700 to perform the features of the present invention as discussed herein. In particular, the computer programs, when executed, enable the processor 704 to perform features of the present invention. Accordingly, such computer programs represent controllers of the computer system 700.

In an embodiment where the invention is implemented using software, the software may be stored in a computer program product and loaded into computer system 700 using removable storage drive 714, hard drive 712, or communications interface 724. The application module 706, when executed by the processor 704, causes the processor 704 to perform the functions of the invention as described herein.

The main memory 708 may be loaded with one or more application modules 706 that can be executed by one or more processors 704 with or without a user input through the I/O interface 730 to achieve desired tasks. In operation, when at least one processor 704 executes one of the application modules 706, the results are computed and stored in the secondary memory 710 (i.e., hard disk drive 712). The status of the computer simulation of inflating an airbag (e.g., finite element analysis results) is reported to the user via the I/O interface 730 either in a text or in a graphical representation.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas only a few particles are shown and described in FIG. 2B for illustration simplicity, there is no limit as to how many corpuscular particles to be used in a simulation and how many collisions between particles, and particle and boundary. Additionally, more than on air inlets or nozzles have been shown to receive forced air from explosive blast, other numbers of inlet or nozzle can achieve the same, for example one. Furthermore, more than one primary pouches have been shown, other numbers of primary pouch can achieve the same, for example, one primary pouch. Finally, whereas the airbag and simulation methods have been shown and described in two dimensional figures and diagrams, the airbag is a three-dimensional object. For example, the primary pouch may be configured around perimeter of a three-dimensional geometry (e.g., a cube), while the secondary pouch is formed by connecting the surrounding primary pouch in the center. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of numerically simulating inflation of an airbag configured with at least primary and secondary connected pouches, the primary pouch being inflated by an explosive blast initially, while the secondary pouch being inflated by air having flowed through one or more interconnection openings between said primary and secondary pouches, said method comprising:

defining a finite element analysis (FEA) model of an airbag in an initial folded configuration, said airbag having at least primary and secondary pouches connected by one or more interconnection openings, said primary and secondary pouches being represented in the FEA model by a first plurality of shell elements and a second plurality of shell elements, respectively;

conducting a first numerical simulation of inflating the primary pouch using the FEA model according to corpuscular particle theory by interacting simulated corpuscular particles with one another and with the first plurality of shell elements, said simulated corpuscular particles being created according to an explosive blast's strength and each of the simulated corpuscular particles being assigned with a numerical kinetic energy;

conducting, in conjunction with the first numerical simulation, a second numerical simulation of inflating the secondary pouch using the FEA model according to control volume theory by converting numerical kinetic energy of those of the simulated corpuscular particles having flowed from the primary pouch to the secondary pouch through the interconnection openings to a uniform pressure acting upon the second plurality of shell elements, wherein said uniform pressure is calculated as follows:

$$p = (\gamma - 1)\frac{E_0 + E_{in}}{V}$$

where:
p is the uniform pressure,
V is the secondary pouch's volume,
$\gamma$ is a gas dependent property—a ratio between heat capacities at constant pressure and at constant volume,
$E_0$ is the secondary pouch's existing numerical kinetic energy accumulated during prior solution cycles from those corpuscular particles that have flowed through the interconnected opening into the secondary pouch,
$E_{in}$ is the numerical kinetic energy of said those of the simulated corpuscular particles having flowed from the primary pouch to the secondary pouch,
continuing the first and second numerical simulations until both said primary and secondary pouches have been determined to be fully inflated.

2. The method of claim 1, wherein the explosive blast's strength is defined by gas mass flow rate, temperature, and total number of the simulated corpuscular particles to be used in the first numerical simulation.

3. The method of claim 2, wherein each of the simulated corpuscular particles is assigned with an arbitrarily random direction injected into the primary pouch.

4. The method of claim 3, wherein the corpuscular particle theory includes tracking the simulated corpuscular particles for collisions with one another and with the first plurality of shell elements.

5. The method of claim 4, wherein said collisions including transferring the numerical kinetic energy between two of the simulated corpuscular particles or between one of the simulated corpuscular particles and one of the first plurality of shell elements.

6. The method of claim 1, wherein the uniform pressure further includes a contribution from ambient air pressure when the secondary pouch is configured with one or more outside openings allowing ambient air to flow in during said inflating the secondary pouch.

7. A non-transitory computer readable storage medium containing computer executable instructions for numerically simulating inflation of an airbag configured with at least primary and secondary connected pouches, the primary pouch being inflated by an explosive blast initially, while the secondary pouch being inflated by air having flowed through one or more interconnection openings between said primary and secondary pouches by a method comprising:

defining a finite element analysis (FEA) model of an airbag in an initial folded configuration, said airbag having at least primary and secondary pouches connected by one or more interconnection openings, said primary and secondary pouches being represented in the FEA model by a first plurality of shell elements and a second plurality of shell elements, respectively;

conducting a first numerical simulation of inflating the primary pouch using the FEA model according to corpuscular particle theory by interacting simulated corpuscular particles with one another and with the first plurality of shell elements, said simulated corpuscular particles being created according to an explosive blast's strength and each of the simulated corpuscular particles being assigned with a numerical kinetic energy;

conducting, in conjunction with the first numerical simulation, a second numerical simulation of inflating the secondary pouch using the FEA model according to control volume theory by converting numerical kinetic energy of those of the simulated corpuscular particles having flowed from the primary pouch to the secondary pouch through the interconnection openings to a uniform pressure acting upon the second plurality of shell elements, wherein said uniform pressure is calculated as follows:

$$p = (\gamma - 1)\frac{E_0 + E_{in}}{V}$$

where:
p is the uniform pressure,
V is the secondary pouch's volume,
$\gamma$ is a gas dependent property—a ratio between heat capacities at constant pressure and at constant volume,
$E_0$ is the secondary pouch's existing numerical kinetic energy accumulated during prior solution cycles from those corpuscular particles that have flowed through the interconnected opening into the secondary pouch, Ein is the numerical kinetic energy of said those of the simulated corpuscular particles having flowed from the primary pouch to the secondary pouch, continuing the first and second numerical simulations until both said primary and secondary pouches have been determined to be fully inflated.

8. The non-transitory computer readable storage medium of claim 7, wherein the explosive blast's strength is defined by gas mass flow rate, temperature, and total number of the simulated corpuscular particles to be used in the first numerical simulation.

9. The non-transitory computer readable storage medium of claim 8, wherein each of the simulated corpuscular particles is assigned with an arbitrarily random direction injected into the primary pouch.

10. The non-transitory computer readable storage medium of claim 9, wherein the corpuscular particle theory includes tracking the simulated corpuscular particles for collisions with one another and with the first plurality of shell elements.

11. The non-transitory computer readable storage medium of claim 10, wherein said collisions including transferring the numerical kinetic energy between two of the simulated corpuscular particles or between one of the simulated corpuscular particles and one of the first plurality of shell elements.

12. The non-transitory computer readable storage medium of claim 7, wherein the uniform pressure further includes a contribution from ambient air pressure when the secondary pouch is configured with one or more outside openings allowing ambient air to flow in during said inflating the secondary pouch.

13. A system for numerically simulating inflation of an airbag configured with at least primary and second connected pouches, the primary pouch being inflated by an explosive blast initially, while the secondary pouch being inflated by air having flowed through one or more interconnection openings between said primary and secondary pouches, the system comprising:

an input/output (I/O) interface;

a memory for storing computer readable code for one or more application modules configured for airbag deployment simulation;

at least one processor coupled to the memory, said at least one processor executing the computer readable code in the memory to cause said one or more application modules to perform operations of:

defining a finite element analysis (FEA) model of an airbag in an initial folded configuration, said airbag having at least primary and secondary pouches connected by one or more interconnection openings, said primary and secondary pouches being represented in the FEA model by a first plurality of shell elements and a second plurality of shell elements, respectively;

conducting a first numerical simulation of inflating the primary pouch using the FEA model according to corpuscular particle theory by interacting simulated corpuscular particles with one another and with the first plurality of shell elements, said simulated corpuscular particles being created according to an explosive blast's strength and each of the simulated corpuscular particles being assigned with a numerical kinetic energy;

conducting, in conjunction with the first numerical simulation, a second numerical simulation of inflating the secondary pouch using the FEA model according to control volume theory by converting numerical kinetic energy of those of the simulated corpuscular particles having flowed from the primary pouch to the secondary pouch through the interconnection openings to a uniform pressure acting upon the second plurality of shell elements, wherein said uniform pressure is calculated as follows:

$$p = (\gamma - 1)\frac{E_0 + E_{in}}{V}$$

where:

p is the uniform pressure,

V is the secondary pouch's volume,

γ is a gas dependent property—a ratio between heat capacities at constant pressure and at constant volume, Eo is the secondary pouch's existing numerical kinetic energy accumulated during prior solution cycles from those corpuscular particles that have flowed through the interconnected opening into the secondary pouch, Ein is the numerical kinetic energy of said those of the simulated corpuscular particles having flowed from the primary pouch to the secondary pouch, continuing the first and second numerical simulations until both said primary and secondary pouches have been determined to be fully inflated.

14. The system of claim 13, wherein the explosive blast's strength is defined by gas mass flow rate, temperature, and total number of the simulated corpuscular particles to be used in the first numerical simulation.

15. The system of claim 14, wherein each of the simulated corpuscular particles is assigned with an arbitrarily random direction injected into the primary pouch.

16. The system of claim 15, wherein the corpuscular particle theory includes tracking the simulated corpuscular particles for collisions with one another and with the first plurality of shell elements.

17. The system of claim 13, wherein the uniform pressure further includes a contribution from ambient air pressure when the secondary pouch is configured with one or more outside openings allowing ambient air to flow in during said inflating the secondary pouch.

* * * * *